United States Patent
Matayabas et al.

(10) Patent No.: US 7,030,483 B2
(45) Date of Patent: Apr. 18, 2006

(54) POLYMER SOLDER HYBRID INTERFACE MATERIAL WITH IMPROVED SOLDER FILLER PARTICLE SIZE AND MICROELECTRONIC PACKAGE APPLICATION

(75) Inventors: James C Matayabas, Chandler, AZ (US); Ashay A. Dani, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/612,328

(22) Filed: Jun. 30, 2003

(65) Prior Publication Data

US 2004/0262740 A1    Dec. 30, 2004

(51) Int. Cl.
   *H01L 23/10*    (2006.01)
   *H01L 23/34*    (2006.01)

(52) U.S. Cl. .................................. 257/706; 257/713

(58) Field of Classification Search ............... 257/706, 257/707, 713, 720
See application file for complete search history.

(56) References Cited

U.S. PATENT DOCUMENTS

| | | | |
|---|---|---|---|
| 6,469,381 B1 * | 10/2002 | Houle et al. ................ | 257/707 |
| 2003/0150604 A1 * | 8/2003 | Koning et al. .............. | 165/185 |
| 2003/0153667 A1 * | 8/2003 | Jayaraman et al. ......... | 524/432 |

* cited by examiner

*Primary Examiner*—Howard Weiss
(74) *Attorney, Agent, or Firm*—Schwegman, Lundberg, Woessner & Kluth, P.A.

(57) ABSTRACT

One embodiment of the invention includes a thermal interface material. The thermal interface material includes a polymer matrix; a plurality of fusible particles dispersed within the polymer matrix; and a plurality of non-fusible particles dispersed within the polymer matrix. The fusible particles have a mean particle size that is greater than the maximum particle size of the non-fusible particles. The thermal interface material improves performance of an integrated circuit.

20 Claims, 4 Drawing Sheets

US 7,030,483 B2

POLYMER SOLDER HYBRID INTERFACE MATERIAL WITH IMPROVED SOLDER FILLER PARTICLE SIZE AND MICROELECTRONIC PACKAGE APPLICATION

TECHNICAL FIELD OF THE INVENTION

Embodiments of the invention relate generally to polymer solder hybrid (PSH) interface material, to microelectronic packages employing the polymer solder hybrid interface material, and to manufacturing methods related thereto.

BACKGROUND OF THE INVENTION

In the field of electronic systems there is an incessant competitive pressure among manufacturers to drive the performance of their equipment up while driving down production costs. This is particularly true regarding the packaging of IC's on substrates, where each new generation of packaging must provide increased performance, particularly in terms of an increased number of components and higher clock frequencies, while generally being smaller or more compact in size. As the density and clock frequency of IC's increase, they accordingly generate a greater amount of heat. However, the performance and reliability of IC's are known to diminish as the temperature to which they are subjected increases, so it becomes increasingly important to adequately dissipate heat from IC environments, including IC packages.

An IC substrate typically includes a number of metal layers selectively patterned to provide metal interconnect lines (referred to herein as "traces"), and one or more electronic component mounted on one or more surfaces of the substrate. The electronic component or components are functionally connected to other elements of an electronic system through a hierarchy of electrically conductive paths that include the substrate traces. The substrate traces typically carry signals that are transmitted between the electronic components, such as IC's, of the system. Some IC's have a relatively large number of input/output (I/O) terminals (also called "lands"), as well as a large number of power and ground terminals or lands.

As the internal circuitry of IC's, such as processors, operates at higher and higher clock frequencies, and as IC's operate at higher and higher power levels, the amount of heat generated by such IC's can increase their operating temperature to unacceptable levels.

Heat spreaders are employed to dissipate the heat generated. A heat spreader is usually located above the die and is thermally coupled to the die by a thermal interface material.

For the reasons stated above, and for other reasons stated below which will become apparent to those skilled in the art upon reading and understanding the present specification, there is a significant need in the art for apparatus and methods for packaging an IC on a substrate that minimize heat dissipation problems associated with high clock frequencies and high power densities.

IN THE DRAWINGS

DETAILED DESCRIPTION

Thermal interface material (TIM) embodiments of the invention include a polymer matrix, fusible filler particles dispersed in the curable polymer matrix, and non-fusible filler particles, also dispersed in the curable polymer matrix, wherein fusible filler particles have a mean particle size that is greater than the maximum particle size of the non-fusible particles. The thermal interface embodiments have use in integrated circuits. Embodiments of the invention also include integrated circuits (IC's) that include the thermal interface material, electronic assemblies and systems utilizing the thermal interface material and methods for making the thermal interface material, as well as devices and systems utilizing the thermal interface material. As used herein, "fusible filler particles" include solder.

The thermal interface material embodiments of the invention impart to IC's, an improved thermal performance when compared to IC's that do not have thermal interface materials having a mean particle size of fusible filler particles that is the same or less than the maximum particle size of non-fusible particles. This improved thermal performance is displayed when thermal interface materials function within integrated circuits having a range of increased and elevated performance requirements. The performance requirements of thermal interface materials have increased because microprocessor architecture has increased the number of transistors while shrinking processor size and increasing clock speed in order to meet market demand for high performance microprocessors. These features have resulted in an escalation of power dissipation was well as an escalation of both raw power and power density at the silicon die level. Embodiments of the invention maximize the thermal performance of the thermal interface material used in high performance microprocessors by providing the lowest end of line (EOL) thermal resistance (Rjc) capable of meeting the thermal requirements for microprocessors.

Figure 1:
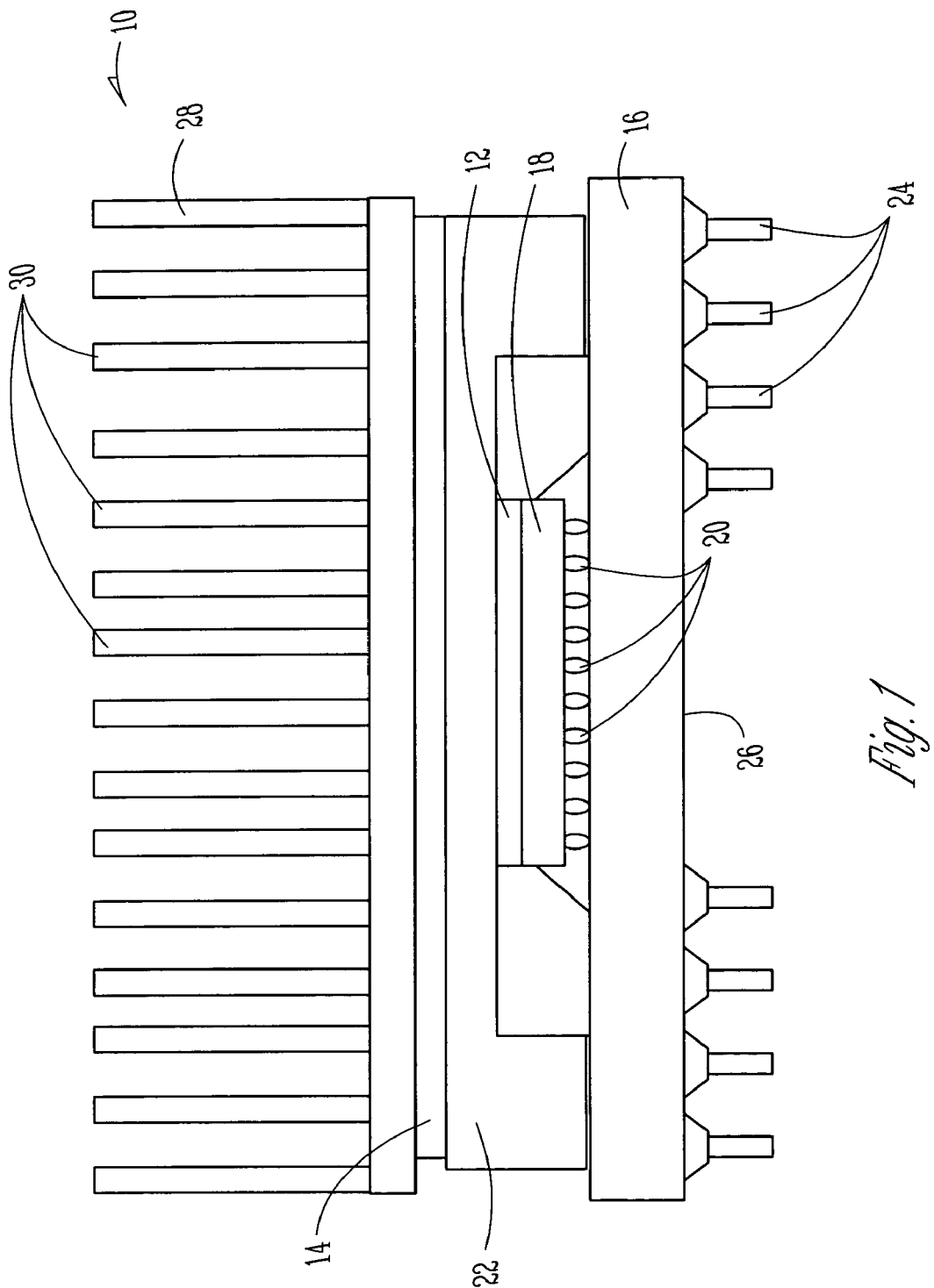
FIG. 1 is a cross-sectional view of an integrated circuit package that includes the thermal interface material (TIM) embodiment of the invention.

One integrated circuit package embodiment of the invention, shown at 10 in FIG. 1, includes the thermal interface material embodiments of the invention at 12 and 14. The integrated circuit package includes a substrate 16 electrically coupled to an integrated circuit or die 18 by solder bumps 20 utilized in a process commonly referred to as controlled collapsed chip connection (C4). A curable thermal interface material 12 is used as thermal material between the integrated circuit or die 18 and an integrated heat spreader 22. Some embodiments of the integrated circuit package include a plurality of pins 24 that are attached to a bottom surface 26 of the substrate 12.

The integrated circuit or die 18 generates heat that is removed from the integrated circuit package 10. The integrated heat spreader 22 is thermally coupled to the integrated circuit 18 to facilitate removal of heat from the integrated circuit 18. The heat spreader 22 includes metal and metal alloys that include include gold, nickel, and copper, composite materials, diamond, AlSiC, and other heat conductive materials. In some embodiments, the metal and metal alloys are optionally coated with another metal or include a thermally conductive composite material.

To decrease the thermal impedance between the integrated circuit 18 and the heat spreader 22, thermal interface material 12 is placed between the integrated circuit 18 and the heat spreader 22. The thermal interface material used includes a polymer solder hybrid composition that includes fusible particles and non-fusible filler particles such that the mean particle size of the fusible filler particles is greater than the maximum particle size of the non-fusible filler particles.

The integrated circuit package 10 also includes a thermal element such as a heat sink, shown at 28, which has a plurality of fins 30. To decrease the thermal impedance between the integrated circuit 18 and the thermal element 28, the second thermal interface material 14 is applied and is placed between the heat spreader 22 and the thermal element 28. The second thermal interface material 14, for some embodiments, includes the same polymer as the first thermal interface material 12. For other embodiments, the second thermal interface material 14 includes a different polymer from the first thermal interface material. Both thermal interface materials 12 and 14, include a polymer matrix, fusible filler particles dispersed in the curable polymer matrix, and non-fusible filler particles, also dispersed in the curable polymer matrix, wherein fusible filler particles have a mean particle size that is greater than the maximum particle size of the non-fusible particles.

Figure 2:
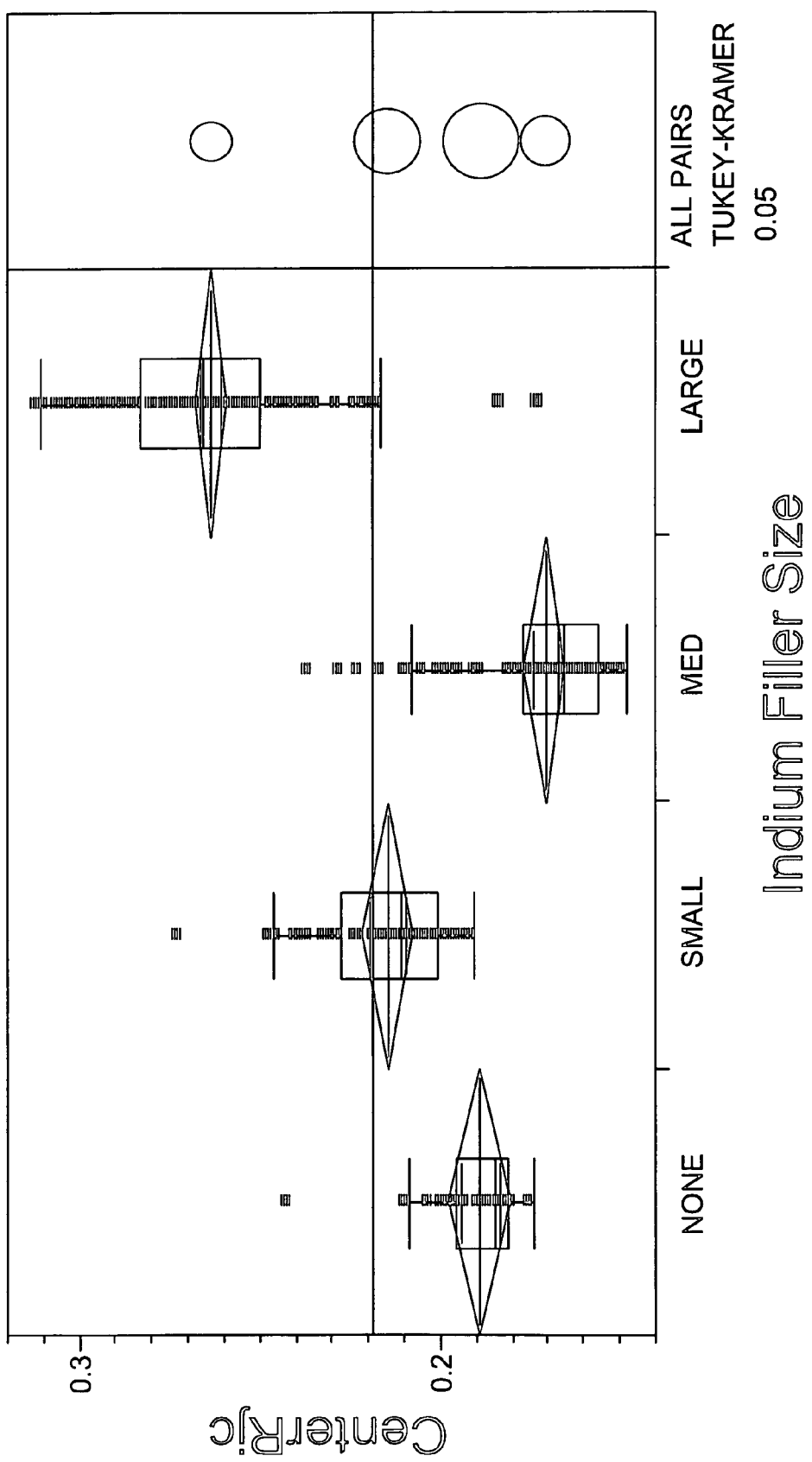
FIG. 2 is a graphical view of particle filler size versus center Rjc of a thermal interface material having small, medium and large filler particles.

A plot of thermal resistance, measured by center Rjc, in a test vehicle for a microelectronic package, for various temperature interface formulations is shown in FIG. 2. The thermal interface material formulations tested included a gel thermal interface material control that did not include fusible particles, identified as "none" in FIG. 2, and three polymer solder hybrid thermale interface material formulations that included indium fusible particles of varying mean particle size. The sizes in Table 1 are designated as "small," "medium" and "large."

Data used to prepare the graph is shown in Table 1:

| Level | Number | Mean | Std. Dev. |
|---|---|---|---|
| None | 29 | 0.189217 | 0.013386 |
| Small | 39 | 0.214942 | 0.017883 |
| Med | 70 | 0.170999 | 0.020240 |
| Large | 98 | 0.263982 | 0.026089 |

It has been observed that when the mean particle size of the indium is small, defined herein as smaller than the maximum size of the non-fusible particles, the Rjc is greater than that of the control, which means that thermal performance is not improved. When the mean particle size of the indium particles is medium, defined as larger than the maximum particle size of the non-fusible filler particles but less than 60 microns, the Rjc is less than that of the control, which means that the thermal performance is improved. It has also been observed that when the mean particle size of the indium is large, defined as greater than about 60 microns, the Rjc is greater than that of the control, which means that the thermal performance is not improved. In this case, the increase in Rjc has been attributed to an increase in the bond line thickness (BLT), which is known to give higher resistance values.

Figure 3:
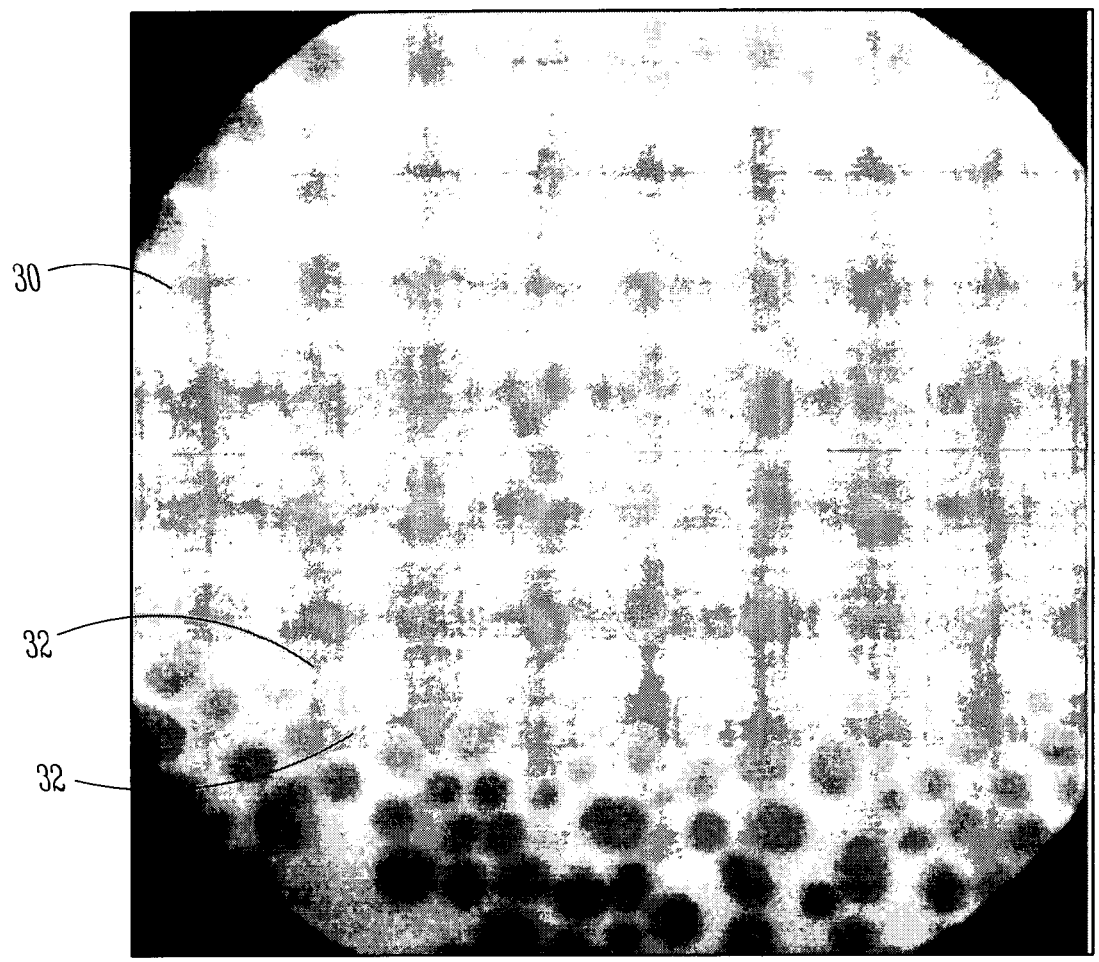
FIG. 3 is a perspective view of polymer solder hybrid thermal interface material embodiment of the invention with filler particles dispersed in the polymer.
Figure 4:
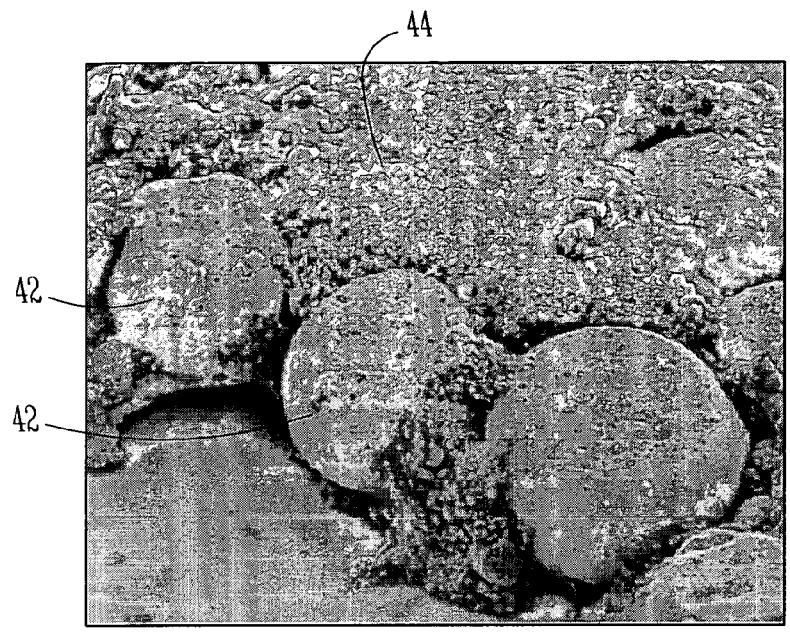
FIG. 4 is a perspective view of polymer solder hybrid thermal interface material embodiment of the invention with filler particles dispersed in the polymer.
Figure 5:
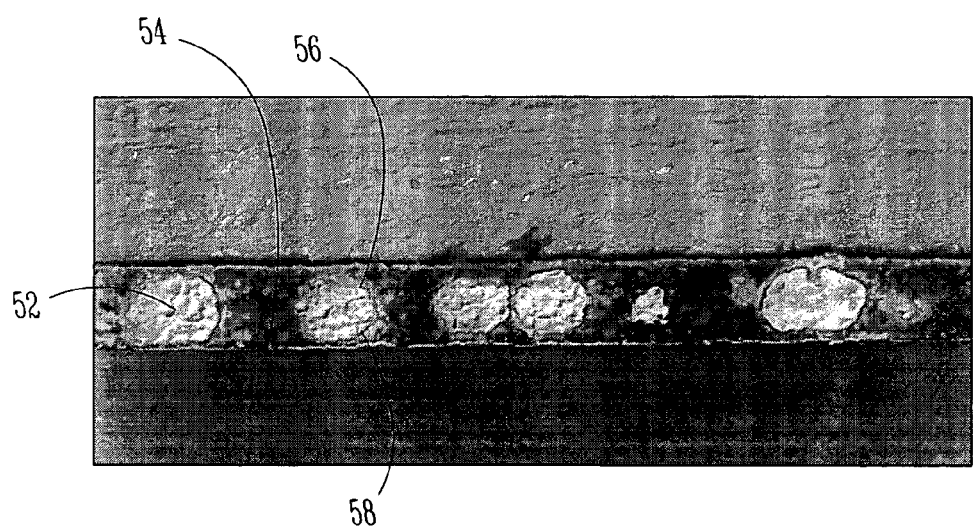
FIG. 5 is a cross-sectional view of polymer solder hybrid thermal interface material illustrating filler particles in the TIM making contact with both a die surface and an integrated heat spreader surface.

Morphology of the polymer solder hybrid thermal interface material is characterized in FIGS. 3, 4 and 5. FIG. 3 illustrates a perspective view of polymer solder hybrid thermal interface material 30 embodiment of the invention with filler particles 32 dispersed in the polymer. FIG. 4 illustrates a perspective view of polymer solder hybrid thermal interface material embodiment of the invention with solder particles 42 dispersed in the polymer 44. FIG. 5 illustrates a cross-sectional view of polymer solder hybrid thermal interface material illustrating solder particles 52 in the polymer 54 making contact with both a die surface 58 and an integrated heat spreader surface 56.

The data displayed in Table 1 and FIG. 5 includes the medium size indium fusible particles in order to demonstrate the importance of a presence of fusible particles that contact surfaces of both the die 18 and integrated heat spreader surface 22. Without being bound by a particular theory, it is believed that when the solder particles are small relative to the non-fusible filler, that a much smaller concentration of solder material is able to contact both the die18 and the integrated heat spreader surfaces, thereby reducing thermal performance. Further, since the bulk thermal conductivity of the fusible material is less than that of the non-fusible particles, the resulting thermal performance is worse than that of the gel thermal interface material control that does not contain fusible particles. In the case in which the mean particle size of the fusible particles is greater than about 60 microns, the bond line thickness (BLT) of the polymer solder hybrid thermal interface material increases such that thermal resistance increases.

The polymer solder hybrid thermal interface material embodiments of the invention include a curable polymer matrix and fusible particles, optionally with additional additives that improve desired properties, such as non-fusible thermally conductive particles and surfactants for improving wetting and adhesion to various surfaces.

The fusible particles, also known as solder material, used in embodiments of the invention have a melting point below about 250 degrees Centigrade. Solder materials used in embodiments of the invention include pure metals, such as indium and tin, alloys of several metals such as In, Cu, Ag, Sn, Bi, Pb, Cd, Zn, Ga, In, Te, Hg, Tl, Sb, Se, Po, or mixtures of any two or more thereof, or another metal or alloy having a melting point lower than that of the metal powder in component. In one embodiment, the solder material is indium.

Polymers usable in the curable matrix embodiments of the invention include siloxanes, olefins, and epoxies. In one embodiment, the polymer matrix is siloxane, such as vinyl terminated polydimethylsiloxane, poly(dimethyl siloxane-co-hydromethyl siloxane) crosslinker, catalyst, and inhibitor that includes a silane that includes an alkylene unit. Polymeric resins usable in the polymer solder hybrid include any thermosetting resin (either monomeric or polymeric) that is cross-linkable by the curing agent, a metal catalyst or a hydroxyl group-bearing agent. Resins which meet this requirement include epoxies, phenolics, novalacs (both phenolic and creosotic), polyurethanes, polyimides, bismaleimides, maleimides, cyanate esters, polyvinyl alcohols, polyesters, polyureas, acrylics, polyamides, polyacrylates, polysiloxanes, cyanoacrylates, and the like. Other resin systems are modifiable to be cross-linkable by the curing agent, a metal catalyst or a hydroxyl group-bearing agent. Examples of such resins include acrylics, rubbers (butyl, nitrile, etc), polyamides, polyacrylates, polyethers, polysulfones, polyethylenes, polypropylenes, polysiloxanes, polyvinyl acetates/polyvinyl esters, polyolefins, cyanoacrylates, polystyrenes, and the like.

Another embodiment of the invention includes a method for improving thermal interface material performance. The method includes providing a polymer capable of forming a polymer matrix. Suitable polymers include those listed above. Fusible particles are blended into the polymer. Non-fusible filler particles are also blended into the polymer. The maximum particle size of the non-fusible particles is less than the mean particle size of the fusible particles.

Integrated circuits (IC's) that employ the thermal interface material embodiments of the invention are typically assembled into packages by physically and electrically coupling them to a substrate made of organic or ceramic material. One or more IC packages are physically and electrically coupled to a printed circuit board (PCB) to form an "electronic assembly". The "electronic assembly" is part of an "electronic system." An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

Thus, since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes, which come within the meaning and range of equivalency of the claims, are intended to be embraced therein.

What is claimed is:

1. A thermal interface material, comprising:
   a polymer matrix;
   fusible particles dispersed within the polymer matrix; and
   non-fusible particles dispersed within the polymer matrix, wherein the fusible particles have a mean particle size that is greater than the maximum particle size of the non-fusible particles when fusible particles and non-fusible particles are blended together in the polymer matrix.

2. The thermal interface material of claim 1 wherein the polymer is a polymer solder hybrid.

3. The thermal interface material of claim 1 wherein the mean particle size of the fusible particles is less greater than or equal to about 60 microns.

4. The thermal interface material of claim 1 wherein the fusible particles have a size effective for contacting an upper and lower surface of two elements separated by the thermal interface material.

5. The thermal interface material of claim 1 wherein the fusible particles consist of indium and tin.

6. The thermal interface material of claim 1 wherein the fusible materials comprise In, Bi, Cu, Ag, Sn, Pb, Cd, Zn, Ga, Te, Hg, Tl, Sb, Se, Po, or mixtures of any two or more thereof or alloys thereof.

7. The thermal interface material of claim 1 wherein the polymer comprises one or more of siloxanes, olefins, and epoxies.

8. The thermal interface material of claim 1 wherein the polymer comprises a vinyl terminated polydimethylsiloxane, a crosslinker; a platinum catalyst; and an inhibitor.

9. An integrated circuit, comprising:
   at least one silicon die;
   the thermal interface material of claim 1; and
   an integral heat spreader, wherein the thermal interface material is sandwiched between the silicon die and the integral heat spreader.

10. The integrated circuit of claim 9, wherein the fusible particles in the thermal interface material have a size effective for contacting both the integral heat spreader and the silicon die.

11. The integrated circuit of claim 9 further comprising a heat sink and a second thermal interface component, wherein the second thermal interface material component is sandwiched between the integral heat spreader and the heat sink.

12. The integrated circuit of claim 11 wherein the second thermal interface material component comprises the thermal interface material of claim 1.

13. The integrated circuit of claim 9 further comprising a form factor.

14. The integrated circuit of claim 13 wherein the form factor is a ball grid array.

15. The integrated circuit of claim 13 wherein the form factor is a ball grid array with pinned interposers and wire bonding.

16. An electronic assembly comprising the electronic package of claim 8.

17. An electronic assembly comprising the thermal interface material of claim 1.

18. An electronic assembly comprising the thermal interface material of claim 9.

19. An electronic system comprising the integrated circuit of claim 9.

20. The integrated circuit of claim 13 wherein the form factor is a pin grid array.

* * * * *

UNITED STATES PATENT AND TRADEMARK OFFICE
CERTIFICATE OF CORRECTION

PATENT NO.       : 7,030,483 B2
APPLICATION NO.  : 10/612328
DATED            : April 18, 2006
INVENTOR(S)      : Matayabas et al.

Page 1 of 1

It is certified that error appears in the above-identified patent and that said Letters Patent is hereby corrected as shown below:

On the face page, in field (75), in "Inventors", in column 1, line 1, after "Matayabas," insert -- Jr. --.

In column 5, line 47, in Claim 3, after "less" delete "greater".

Signed and Sealed this

Twenty-sixth Day of September, 2006

JON W. DUDAS
*Director of the United States Patent and Trademark Office*